US012671229B2

(12) United States Patent
Chin et al.

(10) Patent No.: US 12,671,229 B2
(45) Date of Patent: Jun. 30, 2026

(54) OPTICAL SIGNAL TRANSMITTER

(71) Applicant: NTT, Inc., Tokyo (JP)

(72) Inventors: Meishin Chin, Musashino (JP);
Takahiko Shindo, Musashino (JP);
Shigeru Kanazawa, Musashino (JP)

(73) Assignee: NTT, Inc., Tokyo (JP)

( * ) Notice: Subject to any disclaimer, the term of this
patent is extended or adjusted under 35
U.S.C. 154(b) by 764 days.

(21) Appl. No.: 18/003,593

(22) PCT Filed: Jul. 2, 2020

(86) PCT No.: PCT/JP2020/026103
§ 371 (c)(1),
(2) Date: Dec. 28, 2022

(87) PCT Pub. No.: WO2022/003925
PCT Pub. Date: Jan. 6, 2022

(65) Prior Publication Data
US 2023/0268713 A1     Aug. 24, 2023

(51) Int. Cl.
*H01S 5/026*     (2006.01)
*H01S 5/062*     (2006.01)
*H01S 5/0625*    (2006.01)
*H01S 5/125*     (2006.01)

(52) U.S. Cl.
CPC ............ *H01S 5/0265* (2013.01); *H01S 5/062*
(2013.01); *H01S 5/06256* (2013.01); *H01S*
*5/06258* (2013.01); *H01S 5/125* (2013.01)

(58) Field of Classification Search
None
See application file for complete search history.

(56) References Cited

U.S. PATENT DOCUMENTS 5,177,758 A * 1/1993 Oka .......................... H01S 5/10
                                                       372/50.11
5,808,314 A * 9/1998 Nakajima .............. H04B 10/50
                                                       257/85
(Continued)

FOREIGN PATENT DOCUMENTS

CN        103956652 B  *  8/2018  .......... H01S 5/4031
JP        H04198913 A  *  7/1992
(Continued)

OTHER PUBLICATIONS

Wataru Kobayashi et al., *Novel Approach for Chirp and Output Power Compensation Applied to a 40-Gbit/s EADFB Laser Integrated with a Short SOA*, Optics Express, vol. 23, No. 7, Apr. 6, 2015, pp. 1-10.

*Primary Examiner* — Tod T Van Roy
(74) *Attorney, Agent, or Firm* — Workman Nydegger

(57)          ABSTRACT

An optical signal transmitter (AXEL) in which a quality of an optical signal waveform is maintained includes a distributed Bragg reflector to be coupled with an emission end surface of an SOA in an optical circuit unit including an optical waveguide core portion formed on an upper surface of a substrate. In the optical circuit unit, a diffraction grating formed on an upper surface side opposite to an absorption layer of an EA optical modulator and a diffraction grating formed on an upper surface side of a reflection layer of the distributed Bragg reflector have a wavelength selectivity.

5 Claims, 8 Drawing Sheets

(56)                  References Cited

U.S. PATENT DOCUMENTS

| | | | | |
|---|---|---|---|---|
| 6,822,980 | B2 * | 11/2004 | Lundqvist | H01S 5/06256 |
| | | | | 372/50.1 |
| 7,245,644 | B2 * | 7/2007 | Kang | H01S 5/026 |
| | | | | 372/50.1 |
| 7,447,246 | B2 * | 11/2008 | He | H01S 5/12 |
| | | | | 372/20 |
| 8,149,890 | B2 * | 4/2012 | Park | H01S 5/06258 |
| | | | | 372/34 |
| 8,687,665 | B1 * | 4/2014 | Tauke-Pedretti | H01S 5/1021 |
| | | | | 372/25 |
| 10,128,632 | B2 * | 11/2018 | Kobayashi | H01S 5/042 |
| 10,505,343 | B2 * | 12/2019 | Kobayashi | H01S 5/4012 |
| 11,050,218 | B2 * | 6/2021 | Komatsu | H01S 5/0687 |
| 11,128,104 | B2 * | 9/2021 | Miura | H01S 5/18302 |
| 11,233,375 | B2 * | 1/2022 | Matsui | H01S 5/1225 |
| 12,062,884 | B2 * | 8/2024 | Kwon | H01S 5/02461 |
| 12,288,962 | B2 * | 4/2025 | Shindo | H01S 5/34 |

| | | | | |
|---|---|---|---|---|
| 2004/0179569 | A1 * | 9/2004 | Sato | H01S 5/4068 |
| | | | | 372/20 |
| 2005/0100345 | A1 * | 5/2005 | Welch | H04B 10/50 |
| | | | | 398/183 |
| 2015/0010264 | A1 * | 1/2015 | Kaneko | G02F 1/0147 |
| | | | | 385/10 |
| 2019/0036293 | A1 * | 1/2019 | Kobayashi | H01S 5/026 |
| 2020/0028326 | A1 * | 1/2020 | Miura | H01S 5/06256 |
| 2020/0212650 | A1 * | 7/2020 | Komatsu | H01S 5/06256 |
| 2022/0181846 | A1 * | 6/2022 | Sun | H01S 5/1039 |
| 2022/0231478 | A1 * | 7/2022 | Yamatoya | H01S 5/1203 |
| 2023/0268713 | A1 * | 8/2023 | Chin | H01S 5/06256 |
| | | | | 372/50.11 |

FOREIGN PATENT DOCUMENTS

| | | | | |
|---|---|---|---|---|
| JP | | 2003069135 A | * | 3/2003 |
| WO | WO-2017135381 A1 | * | 8/2017 | H01S 5/026 |

* cited by examiner

Fig. 1

PRIOR ART

Fig. 2

PRIOR ART

PRIOR ART (a)    PRIOR ART (b)

OPTICAL SIGNAL TRANSMITTER

TECHNICAL FIELD

The present invention relates to an optical signal transmitter in which a distributed feedback (hereinafter, referred to as DFB) laser, an electro absorption (hereinafter, referred to as EA) optical modulator, and a semiconductor optical amplifier (hereinafter, referred to as SOA) are integrated in an optical circuit unit.

BACKGROUND ART

An EADFB laser that is an example of the optical signal transmitter has higher extinction characteristics and more excellent chirp characteristics than a direct modulation type laser. Note that the chirp characteristics indicate a minute and dynamic wavelength fluctuation occurred when an optical carrier wave is modulated. Therefore, the EADFB laser has been used for various applications including a light source for an access system network before.

Figure 1:
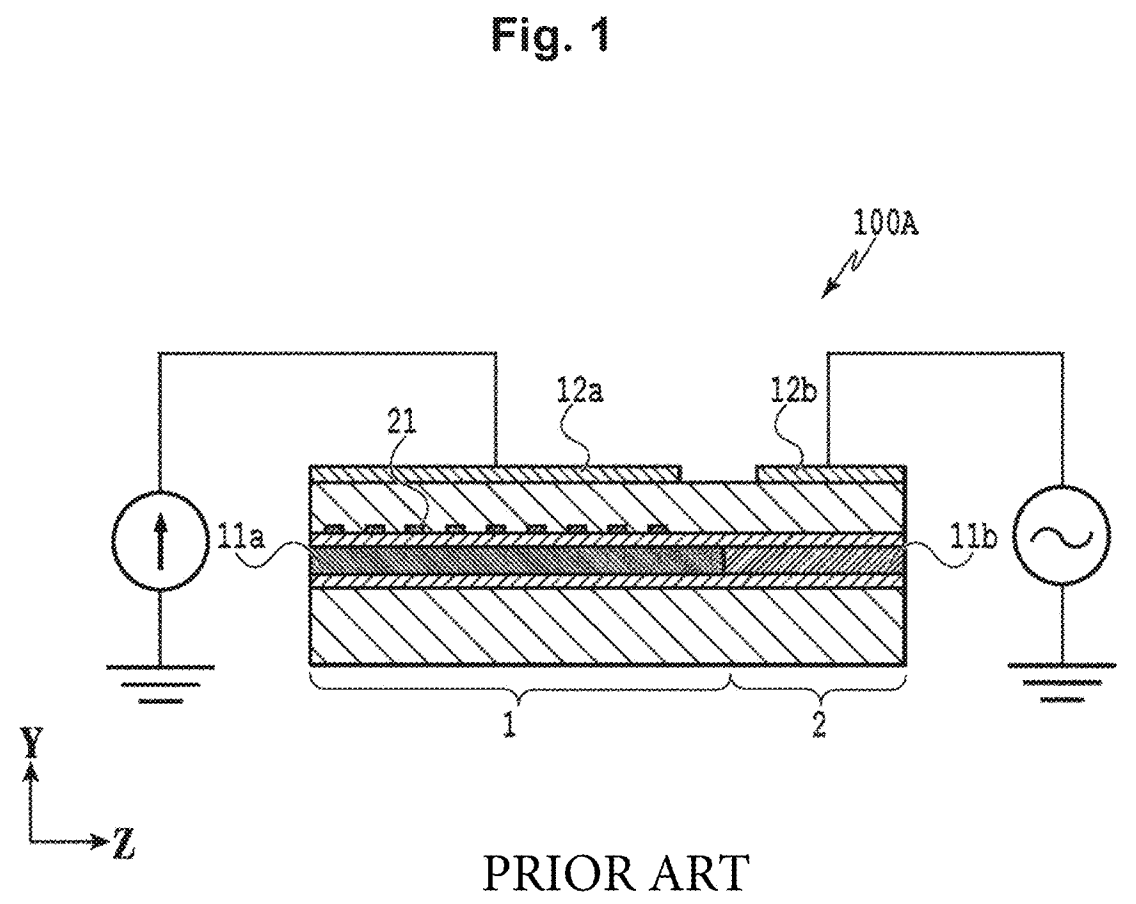

FIG. 1 is a side sectional view illustrating a schematic configuration of a traditional EADFB laser 100A. Referring to FIG. 1, in the EADFB laser 100A, an optical circuit unit including an optical waveguide core portion is formed on an upper surface that is one main surface of a substrate formed of a compound semiconductor such as InP (not illustrated). Then, the optical circuit unit has a structure therein in which a DFB laser 1 and an EA optical modulator 2 are integrated.

In each part of the EADFB laser 100A, the DFB laser 1 includes an active layer 11a that has a multiple quantum well (MQW) structure between an underclad layer and an overclad layer. Then, the DFB laser 1 oscillates with a single wavelength by a diffraction grating 21 formed on an upper surface side opposite to the active layer 11. The EA optical modulator 2 includes an absorption layer 11b that has a multiple quantum well structure and is formed of a composition material different from the DFB laser 1 between the underclad layer and the overclad layer and can change a light absorption amount through voltage control. In addition, electrodes 12a and 12b formed on the upper surfaces of the overclad layer of the DFB laser 1 and the EA optical modulator 2 are arranged to be separated from each other and are respectively connected to individual power supplies. Depending on an intensity of an electric field added to electric field absorption to the absorption layer 11b of the EA optical modulator 2, the EA optical modulator 2 modulates a light intensity.

In the EADFB laser 100A, the active layer 11a and the absorption layer 11b form the optical waveguide core portion together. Then, the EADFB laser 100A is driven under a condition in which output light from the active layer 11a of the DFB laser 1 passes through and is absorbed by the absorption layer 11b of the EA optical modulator 2. As a result, light is blinked, and the EA optical modulator 2 can convert an electrical signal into an optically-modulated optical signal. However, in a case of the EADFB laser 100A, there is a problem in that, since the EA optical modulator 2 has a large optical loss, it is difficult to increase output.

With the EADFB laser 100A illustrated in FIG. 1, there is a case where the EA optical modulator 2 has a large optical loss and it is difficult to increase light to be output. On the other hand, Non Patent Literature 1 proposes an AXEL (indicating SOA assisted extended reach EADFB laser, and hereinafter, referred to as AXEL) that further integrates an SOA on a light emitting end of the EADFB laser 100A.

FIG. 2 is a side sectional view illustrating a schematic configuration of an AXEL 100B that is an EADFB laser. Referring to FIG. 2, in the AXEL 100B, an optical circuit unit including an optical waveguide core portion is formed on an upper surface of a substrate formed of a compound semiconductor. Then, the optical circuit unit has a structure therein in which the DFB laser 1, the EA optical modulator 2, and an SOA 3 are integrated.

In each part of the AXEL 100B, the DFB laser 1 includes an active layer 11a-1 having a multiple quantum well structure between an underclad layer and an overclad layer. Then, the DFB laser 1 oscillates with a single wavelength by a diffraction grating 21 formed on an upper surface side opposite to the active layer 11a-1. Furthermore, the EA optical modulator 2 includes an absorption layer 11b that has a multiple quantum well structure and is formed of a composition different from the DFB laser 1 between the underclad layer and the overclad layer and can change a light absorption amount through voltage control. The SOA 3 includes an active layer 11a-2 that has a multiple quantum well structure and is formed of a composition material same as the DFB laser 1 between the underclad layer and the overclad layer and amplifies an optical signal from the EA optical modulator 2. In addition, electrodes 12a, 12b, and 12c formed on the upper surfaces of the overclad layer of the DFB laser 1, the EA optical modulator 2, and the SOA 3 are arranged to be separated from each other and are respectively connected to individual power supplies. Here, depending on an electric field intensity added to electric field absorption to the absorption layer 11b of the EA optical modulator 2, the EA optical modulator 2 modulates a light intensity.

In this AXEL 100B, the active layer 11a-1, the absorption layer 11b, and the active layer 11a-2 form the optical waveguide core portion together. Then, in the AXEL 100B, because the optical signal modulated by the EA optical modulator 2 as in a case of the EADFB laser 100A is further amplified by the active layer 11a-2 of the SOA 3, light output can be improved. As a result, the AXEL 100B obtains a high output characteristic that is about twice of the EADFB laser 100A illustrated in FIG. 1. Furthermore, because the AXEL 100B can operate at high efficiency due to an integration effect of the SOA 3, in a case where the AXEL 100B is driven under an operation condition in which light output same as the EADFB laser 100A is obtained, it is possible to reduce power consumption by about 40%. Moreover, in the AXEL 100B, the active layer 11a-2 of the SOA 3 has the multiple quantum well structure same as the DFB laser. Therefore, the AXEL 100B can manufacture a device with a manufacturing process same as the EADFB laser 100A without adding a regrowth process for integration of the SOA 3.

However, similarly to a general SOA, in a case of the AXEL 100B described above, when strong light enters the SOA 3, a carrier density in the SOA 3 decreases due to simulated emission of light. As a result, an amplification gain of the SOA 3 decreases, and there is a case where an output level of the amplified optical signal decreases. Such a phenomenon is referred to as a pattern effect in the optical communication field because a degree changes according to a ratio of the same sign in a signal to be transmitted within a certain period of time.

FIG. 3 is a schematic diagram of an eye pattern illustrating a non-rerun to zero (NRZ) optical signal waveform in a case where the SOA 3 of the AXEL 100B causes a pattern effect. Note that, an eye pattern in which a zero-level waveform indicated by a characteristic CO and a one-level waveform indicated by a characteristic Cl are combined is illustrated in FIG. 3.

Referring to FIG. 3, in the eye pattern, an eye opening of an optical signal tends to be closed due to the occurrence of the pattern effect. Therefore, a bit error rate increases at the time of transmission. Furthermore, because the carrier density fluctuates in the SOA 3, this changes a refractive index. As a result, because the optical signal is modulated in a state where the carrier density fluctuates, a chirp (wavelength fluctuation) occurs. When the chirp occurs, an effect of dispersion in an optical fiber used for light propagation is received, a waveform of the optical signal is distorted, and this causes the eye opening to be closed. As a result, when the eye opening is closed in the eye pattern, the bit error rate at the time of transmission increases. That is, in a case of the AXEL 100B, there is a problem in that, when strong light enters the SOA 3 and the carrier density in the SOA 3 decreases, the quality of the optical signal waveform deteriorates, and a malfunction occurs in signal processing.

CITATION LIST

Non Patent Literature

Non Patent Literature 1: Wataru Kobayashi, Masakazu Arrai, Takeshi Fujisawa, Tomonari Sato, Toshio Ito, Koichi hasebe, Shigeru Kanazawa, Yuta Ueda, Takayuki Yamanaka, and Hiroaki Sanjoh "Novel approach for chirp and output power compensation applied to a 40-Gbit/S EADFB laser integrated with a short SOA," Opt. Express, Vol. 23, No. 7, pp. 9533-9542, April 2015

SUMMARY OF INVENTION

The present invention has been made to solve the above problems. An object of an embodiment according to the present invention is to provide an optical signal transmitter in which a carrier density in an SOA does not decrease even when light enters the SOA and a quality of an optical signal waveform is maintained.

In order to achieve the above object, one aspect of the present invention is an optical signal transmitter, in which a DFB laser, an EA optical modulator, and one or more SOAs are integrally integrated and a diffraction grating is formed in a region overlapping a light propagation mode of the EA optical modulator so as to modulate a light intensity according to an intensity of an electric field added to the EA optical modulator when light generated by the DFB laser passes through the EA optical modulator and the one or more SOAs in order, includes a distributed Bragg reflector coupled to an emission end surface of the one or more SOAs.

The optical signal transmitter according to one aspect includes a distributed Bragg reflector to be coupled with emission end surfaces of one or more SOAs. If an electric field application state of the EA optical modulator and reflection wavelengths of the EA optical modulator and the distributed Bragg reflector are appropriately set, the carrier density of the optical signal amplified by the SOA can be adjusted so as to suppress a rapid change. Then, the optical signal of which the rapid change in the carrier density is suppressed can be optically output from the distributed Bragg reflector. As a result, even if light enters the SOA, the carrier density in the SOA does not decrease, the quality of the optical signal waveform is maintained, and malfunctions of signal processing can be reduced.

BRIEF DESCRIPTION OF DRAWINGS

FIG. 1 is a side sectional view illustrating a schematic configuration of a traditional optical signal transmitter (EADFB laser).

FIG. 2 is a side sectional view illustrating a schematic configuration of an AXEL that is another traditional optical signal transmitter (EADFB laser).

FIG. 8(a) is a schematic diagram of an eye pattern illustrating a state where the pattern effect of the AXEL illustrated in FIG. 2 occurs. FIG. 8(b) is a schematic diagram of an eye pattern illustrating a state where the occurrence of the pattern effect of the AXEL illustrated in FIG. 4 is prevented.

DESCRIPTION OF EMBODIMENTS

Hereinafter, an optical signal transmitter according to an embodiment of the present invention will be described in detail with reference to the drawings.

Embodiment

Figure 4:
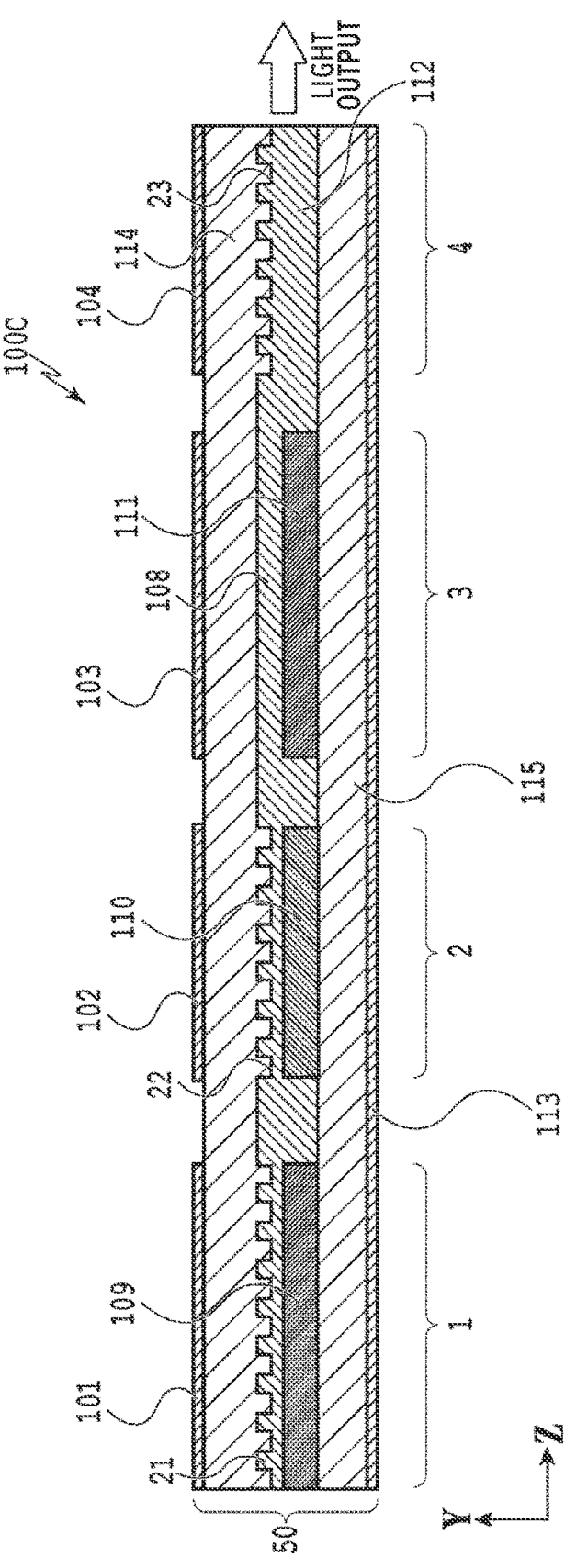
FIG. 4 is a side sectional view illustrating a schematic configuration of an optical signal transmitter (AXEL) according to an embodiment of the present invention.

FIG. 4 is a side view illustrating a schematic configuration of an optical signal transmitter (AXEL 100C) according to an embodiment of the present invention. With reference to FIG. 4, in the AXEL 100C, an optical circuit unit 50 including an optical waveguide core portion is formed on an upper surface of one main surface of a substrate formed of a compound semiconductor such as InP. In a later process, a surface of the substrate facing the optical circuit 50 is polished, and a part of the remaining substrate functions as an underclad 115, and an electrode 113 is formed on a surface of the underclad 115. Furthermore, the optical circuit unit 50 has a structure therein in which a DFB laser 1, an EA optical modulator 2, at least one or more SOAs 3, and a distributed Bragg reflector 4 are integrally (monolithically) integrated. Note that the distributed Bragg reflector 4 is generally known as a distributed Bragg reflector (DBR).

The AXEL 100C includes the distributed Bragg reflector so as to be coupled with an active layer 109 of the DFB laser 1, an absorption layer 110 of the EA optical modulator 2, and an emission end surface of the SOA. In a passive layer 108, diffraction gratings 21 and 22 are respectively formed on a side of an overclad layer 114 opposite to the active layer 109 of the DFB laser 1 and a side of the overclad layer 114 opposite to the absorption layer 110 of the EA optical modulator 2. Furthermore, a diffraction grating 23 is formed on a side of an upper surface of a reflection layer 112 of the distributed Bragg reflector 4. This is a mechanism in which a periodic structure of each of these diffraction gratings 21 to 23 reflects light having a wavelength corresponding to each period.

In each part of the AXEL 100C, the DFB laser 1 includes the active layer 109 between an underclad layer 115 and the overclad layer 114. Then, the DFB laser 1 oscillates at a wavelength λ1 determined according to a wavelength selectivity of the diffraction grating 21 formed on the opposite upper surface side. Furthermore, the EA optical modulator 2 manages optical absorption by the absorption layer 110 formed between the underclad layer 115 and the overclad layer 114 and can change a light absorption amount through voltage control. Then, the EA optical modulator 2 can adjust a carrier density of an optical signal amplified by the SOA 3 according to a wavelength selectivity of the diffraction grating 22 formed on the upper surface side facing the absorption layer 110. The SOA 3 includes an active layer 111 between the underclad layer 115 and the overclad layer 114 and amplifies the optical signal from the EA optical modulator 2.

Note that the active layer 109 of the DFB laser 1, the absorption layer 110 of the EA optical modulator 2, and the active layer 111 of the SOA 3 are arranged separately in the passive layer 108. One of end surfaces of the active layer 109 coincides an end surface of the optical circuit unit 50, and another end surface of the active layer 111 is arranged to be separated from a coupling surface between the passive layer 108 and the reflection layer 112. The distributed Bragg reflector 4 includes the reflection layer 112 between the underclad layer 115 and the overclad layer 114. Then, the distributed Bragg reflector 4 adjusts a reflection wavelength of the amplified optical signal from the SOA 3 according to a wavelength selectivity of the diffraction grating 23 formed on the upper surface side of the reflection layer 112 and optically outputs the optical signal.

On the upper surfaces of the overclad layers 114 of the DFB laser 1, the EA optical modulator 2, and the SOA 3, upper electrodes 101, 102, and 103 are respectively formed at positions facing the active layer 109, the absorption layer 110, and the active layer 111 to be separated from each other. Furthermore, on an upper surface of the overclad layer 114 of the distributed Bragg reflector 4, an upper electrode 104 at a position facing the reflection layer 112. On the other hand, on an entire lower surface of the underclad layer 115, a lower electrode 113 is formed. These upper electrodes 101 to 104 and the lower electrode 113 are connected to the same power supply. Here, depending on an electric field intensity added to electric field absorption to the absorption layer 110 of the EA optical modulator 2, the EA optical modulator 2 modulates a light intensity.

Therefore, the diffraction grating 21 formed on the upper surface side opposite to the active layer 109 of the DFB laser 1 is formed in a region overlapping with a light propagation mode of the EA optical modulator 2. Furthermore, the diffraction grating 22 formed on the upper surface side opposite to the absorption layer 110 of the EA optical modulator 2 and the diffraction grating 23 formed on the upper surface side of the reflection layer 112 of the distributed Bragg reflector 4 are also formed in a region overlapping with the light propagation mode.

Detailed functions will be described. An absorption wavelength of the absorption layer 110 of the EA optical modulator 2 is on a side shorter than the wavelength λ1 by several nm to several 10 nm at the time when no electric field is applied, and almost no light from the DFB laser 1 is absorbed. On the other hand, if a negative voltage of several V is applied from the electrode 102, the absorption wavelength is shifted to a longer wavelength, and light is absorbed. As a result, if the voltage is modulated with a sine wave or a certain rectangular wave pattern, the light intensity can be modulated. At this time, light energy excites electrons to a conduction band, and a pair of positive-hole electrons is generated. As a result, in the absorption layer 110 of the core portion of the EA optical modulator 2, the carrier density increases.

Since the increase in the carrier density changes a refractive index due to a plasma effect, a refractive index decreases in the absorption layer 110 of the EA optical modulator 2. Therefore, since the period of the diffraction grating 22 is effectively shortened, a reflection band of the distributed Bragg reflector 4 at the subsequent stage is shifted to a shorter wavelength. When a reflection wavelength in a state where there is no carrier in the diffraction grating 22 is set to λ2 and a reflection wavelength of the diffraction grating 22 when the absorption layer 110 of the EA optical modulator 2 absorbs light is set to λ3, the active layer 111 of the SOA 3 at the subsequent state has a sufficiently wide gain band. Therefore, the SOA 3 amplifies light with each of the wavelengths λ1, λ2, and λ3. The reflection layer 112 of the distributed Bragg reflector 4 does not include an active layer, and the diffraction grating 23 is formed in a passive region connected to the passive layer 108.

A reflection wavelength λ4 of the diffraction grating 23 of the distributed Bragg reflector 4 is the same as the reflection wavelength λ3 of the diffraction grating 22 of the absorption layer 110 of the EA optical modulator 2 when light is absorbed. That is, a relationship of λ3=λ4 is satisfied. As a result, when light is absorbed, the diffraction gratings 22 and 23 form a resonator with the active layer 111 of the SOA 3 therebetween. As a result, the SOA 3 performs laser oscillation, and carriers are consumed in the active layer 111 of the SOA 3. Conversely, in a case where a negative bias voltage is not applied and the absorption layer 110 of the EA optical modulator 2 does not absorb light, the reflection wavelengths of the diffraction gratings 22 and 23 are different from λ2 and λ4, and accordingly, the resonator is not formed. As a result, in the active layer 111 of the SOA 3, carriers are not consumed. On the other hand, at this time, since light is input from the DFB laser 1, a gain of the active layer 111 of the SOA 3 is consumed for optical amplification in the SOA 3.

Therefore, regardless of a driving state of the absorption layer 110 of the EA optical modulator 2, that is, whether or not light is input from the DFB laser 1, a state where carriers are consumed can be realized in the active layer 111 of the SOA 3. As a result, a rapid carrier density change can be suppressed.

In order to demonstrate such an effect, an optical signal transmitter (AXEL 100C) for a wavelength of 1.55 μm was produced. The optical signal transmitter includes the active layers 109 and 111 and the absorption layer 110 formed of InGaAsP crystal-grown on the upper surface of the substrate formed of InP. In first crystal growth, the active layers 109 and 111 in the DFB laser 1 and the SOA 3 were formed, and then, the absorption layer 110 of the EA optical modulator 2 was formed through butt joint regrowth. An optical waveguide that connects between optical devices and the reflection layer 112 of the distributed Bragg reflector 4 were formed through passive butt joint. Furthermore, the passive layer 108 is formed on the upper side of the active layers 109 and 111 and the absorption layer 110 so as to form a most part of an optical waveguide core portion. In the passive layer 108 and the reflection layer 112, the diffraction gratings 21 to 23 were formed by etching processing, and the optical waveguide core portion was finished.

Lengths of the active layer 109 of the DFB laser 1, the absorption layer 110 of the EA optical modulator 2, the active layer 111 of the SOA 3, and the reflection layer 112 of the distributed Bragg reflector 4 were respectively set to 300 μm, 200 μm, 250 μm, and 80 μm. Furthermore, lengths of all passive optical waveguides that connect between the optical devices in the optical circuit unit 50 were set to 20 μm. In addition, AR (reflection film) coating is applied on an output side of the optical circuit unit 50, and HR (high reflection) coating is applied on an opposite end surface.

Figure 5:
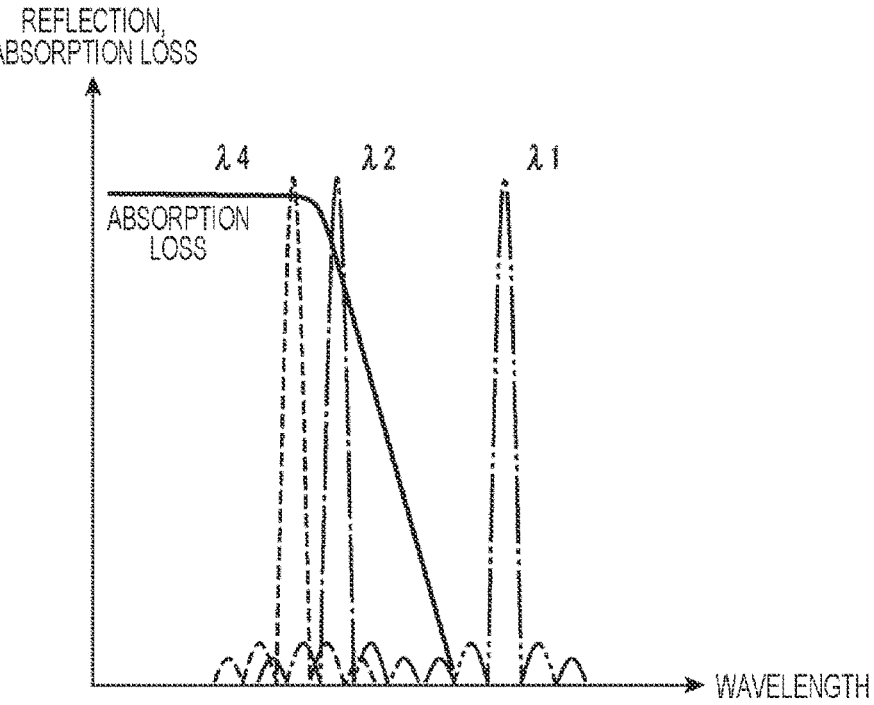
FIG. 5 is a diagram illustrating characteristics of reflection and an absorption loss for a wavelength in a case where a bias voltage is not applied to an EA optical modulator of the AXEL illustrated in FIG. 4.

FIG. 5 is a diagram illustrating characteristics of reflection and an absorption loss for a wavelength in a case where the bias voltage is not applied to the EA optical modulator 2 of the AXEL 100C. Note that a reflection spectrum is normalized by peaks.

Referring to FIG. 5, since an oscillation wavelength $\lambda 1$ of the DFB laser 1 is determined on the basis of the reflection wavelength of the diffraction grating 21, a case can be described where the oscillation wavelength $\lambda 1$ is 1550 nm. Furthermore, the reflection wavelength $\lambda 2$ of the diffraction grating 22 of the EA optical modulator 2 was set to 1530 nm. The absorption wavelength of the absorption layer 110 when the bias voltage is not applied to the EA optical modulator 2 is 1500 nm, and light absorption at 1550 nm is increased by applying a reverse bias voltage. For example, light absorption when a bias voltage of −2 V is applied to the absorption layer 110 of the EA optical modulator 2 is −12 dB, and a current of about 20 mA flows. The reflection wavelength $\lambda 3$ of the diffraction grating 22 of the EA optical modulator 2 at this time was 1527 nm. On the other hand, for example, a case can be described where the reflection wavelength $\lambda 4$ of the reflection layer 112 of the distributed Bragg reflector 4 is designed to be 1527 nm. In such a case, a resonator is formed. In any case, a wavelength of light oscillated as a gain in the SOA 3 is different from the oscillation wavelength $\lambda 1$ of the light from the DFB laser 1.

Figure 6:
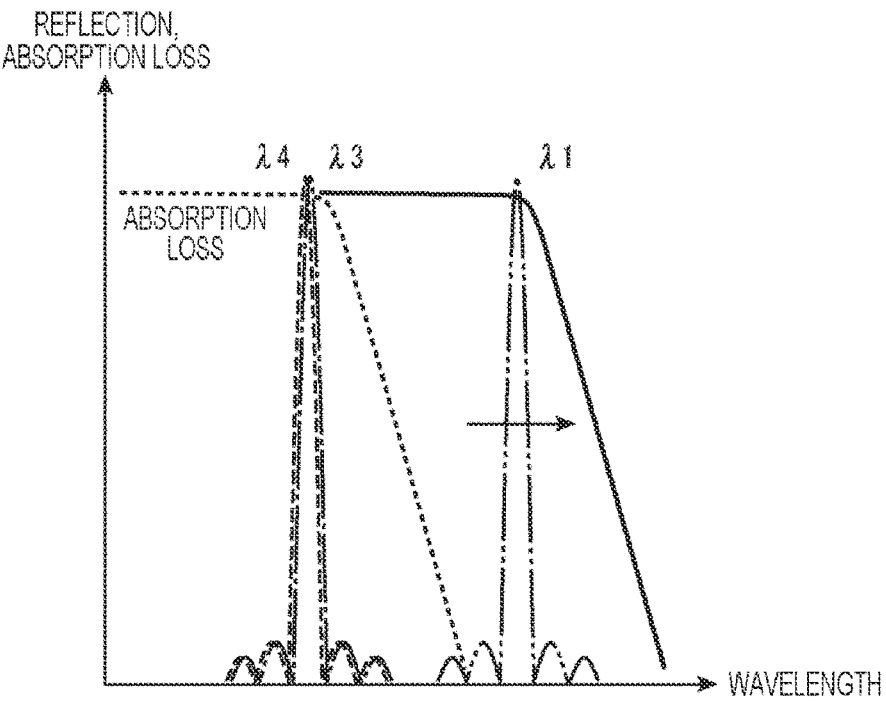
FIG. 6 is a diagram illustrating the characteristics of the reflection and the absorption loss for the wavelength in a case where the bias voltage is applied to the EA optical modulator of the AXEL illustrated in FIG. 4.

FIG. 6 is a diagram illustrating characteristics of reflection and an absorption loss for a wavelength in a case where the bias voltage is applied to the EA optical modulator 2 of the AXEL 100C. Note that a reflection spectrum is also normalized by peaks here.

Referring to FIG. 6, a case is illustrated where a bias voltage of −2 V is applied to the EA optical modulator 2. The absorption loss of the absorption layer 110 is shifted to a longer wavelength side, and strong light is absorbed. Therefore, carriers caused by light absorption are generated in the absorption layer 110. Because this decreases the refractive index, the reflection wavelength $\lambda 3$ of the diffraction grating 22 is shifted to a shorter wavelength side, and the reflection band overlaps the reflection layer 112 of the distributed Bragg reflector 4, and accordingly, the active layer 111 of the SOA 3 oscillates. Reflection of each of the diffraction gratings 22 and 23 is designed to be equal to or higher than 90%. Furthermore, the reflection of the diffraction grating 22 can be lower than the reflection of the diffraction grating 23. Moreover, by significantly strengthening the reflection of the diffraction gratings 22 and 23, light power output from the resonator configured by these diffraction gratings 22 and 23 can be lowered.

Note that, in the present embodiment, although the reflection wavelengths $\lambda 3$ and $\lambda 4$ of the diffraction gratings 22 and 23 are set to be shorter than the oscillation wavelength $\lambda 1$ of the DFB laser 1, the reflection wavelengths $\lambda 3$ and $\lambda 4$ may be alternatively set to be a longer wavelength. In any case, a wavelength of light oscillated as a gain in the SOA 3 is different from the oscillation wavelength $\lambda 1$ of the light from the DFB laser 1.

Figure 7:
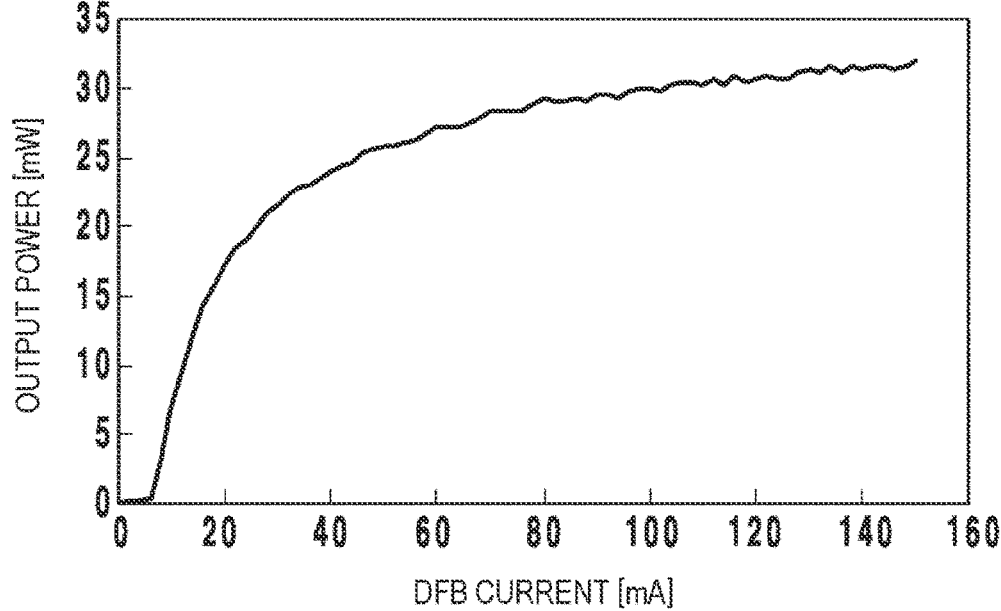
FIG. 7 is a diagram illustrating characteristics of output power for a DFB current of a DFB laser in the AXEL illustrated in FIG. 4.

FIG. 7 is a diagram illustrating characteristics of output power [mW] for a DFB current [mA] of the DFB laser 1 in the AXEL 100C. Here, conditions in a case where a driving current to the DFB laser 1 is zero to 150 mA, the EA optical modulator 2 is opened, and a driving current to the SOA 3 is 100 mA are assumed.

Referring to FIG. 7, it is understood that the output power in the AXEL 100C tends to gradually increase as the DFB current increases and gradually increase near a point at which the DFB current exceeds about 80 mA.

Figure 2:
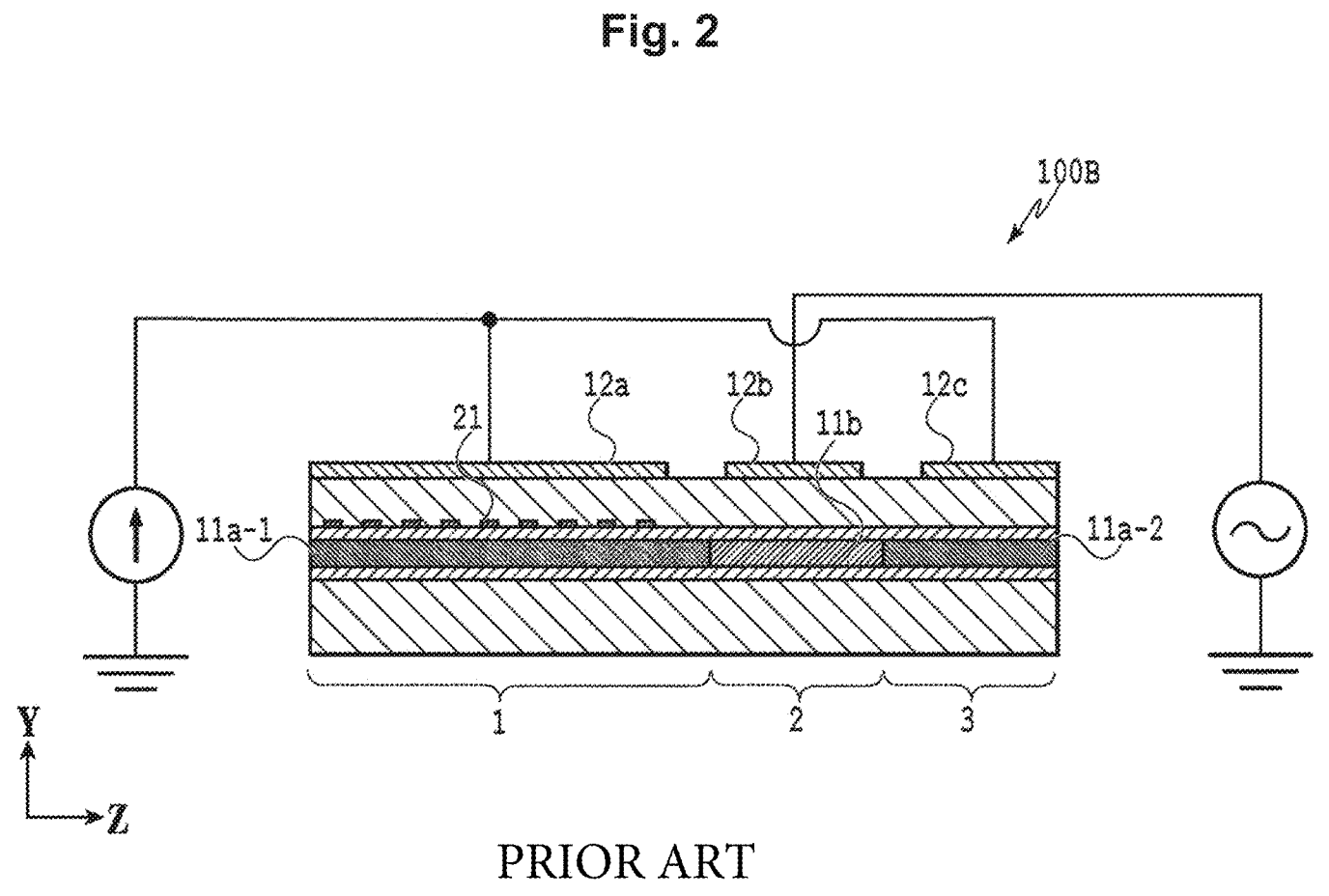
Figure 3:
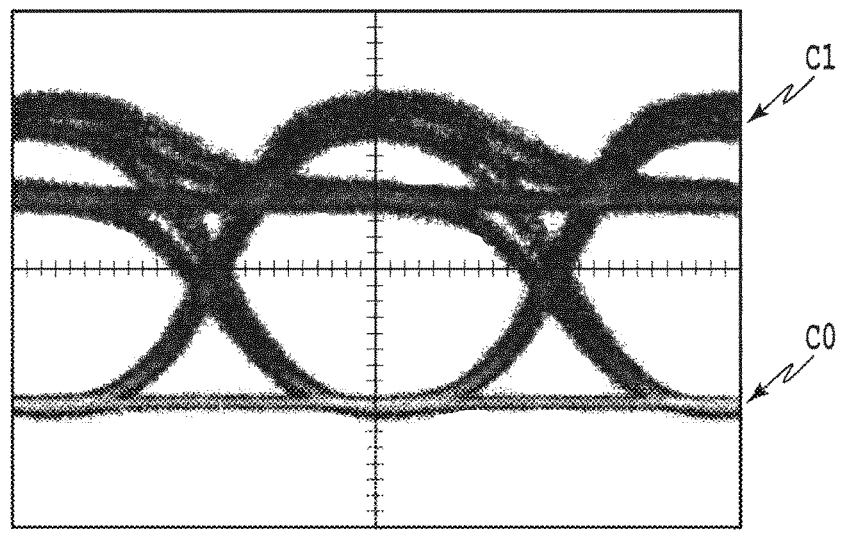
FIG. 3 is a schematic diagram of an eye pattern illustrating an NRZ optical signal waveform in a case where an SOA of the AXEL illustrated in FIG. 2 causes a pattern effect.
Figure 8:
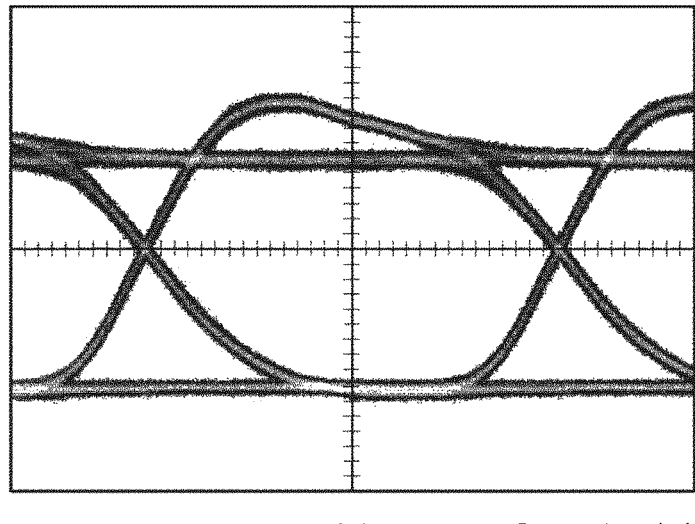
FIG. 8 is a schematic diagram of an eye pattern illustrating an optical signal waveform to explain an effect of the pattern effect of the AXEL illustrated in FIG. 4.

FIG. 8 is a schematic diagram of an eye pattern illustrating an optical signal waveform to explain an effect of a pattern effect of the AXEL 100C. FIG. 8(a) is a schematic diagram of an eye pattern illustrating a state where a pattern effect of the AXEL 100B illustrated in FIG. 2 occurs. FIG. 8(b) is a schematic diagram of an eye pattern illustrating a state where the occurrence of the pattern effect of the AXEL 100C illustrated in FIG. 4 is prevented. Note that, in FIGS. 8(a) and 8(b), the driving current of the DFB laser 1 is set to 150 mA, and the bias voltage to the EA optical modulator 2 is set to −1 V. Then, FIGS. 8(a) and 8(b) illustrate an eye pattern under conditions in which a modulation amplitude of the EA optical modulator 2 is set to 1.5 Vpp, a modulation speed is set to 10 Gbit/s, and the SOA 3 is amplified with a driving current of 100 mA. Furthermore, these eye patterns illustrate a state where a zero-level waveform and a one-level waveform are combined as described with reference to FIG. 3.

Referring to the eye pattern in FIG. 8(a), a state is found in which an overshoot is observed in a signal and the signal is affected by the pattern effect. On the other hand, referring to the eye pattern in FIG. 8(b), a state is found in which an overshoot of the signal is suppressed and the pattern effect is suppressed.

A feature of the configuration of the AXEL 100C described above is a point that the Distributed Bragg reflector 4 coupled to the emission end surface of the SOA 3 is included in the optical circuit unit 50, in addition to the DFB laser 1, the EA optical modulator 3, and the SOA 3. Furthermore, in the optical circuit unit 50, the diffraction grating 22 formed on the upper surface side opposite to the absorption layer 110 of the EA optical modulator 2 and the diffraction grating 23 formed on the upper surface side of the reflection layer 112 of the distributed Bragg reflector 4 have a wavelength selectivity. Therefore, it is sufficient to appropriately set the electric field application state of the EA optical modulator 2 and the wavelength selectivity of the reflection wavelengths of the diffraction gratings 22 and 23 of the EA optical modulator 2 and the distributed Bragg reflector 4. As a result, the rapid change in the carrier density of the optical signal amplified by the SOA 3 is adjusted to be suppressed, and the optical signal of which the rapid change in the carrier density is suppressed can be optically output from the distributed Bragg reflector 4.

In short, when the EA optical modulator 3 is turned off and light is not extinct, only the oscillation wavelength $\lambda 1$ of the DFB laser 1 is amplified by the SOA 3, and when the EA optical modulator 3 is turned on and light is extinct, the SOA 3 oscillates, and the light with the reflection wavelength $\lambda 3 = \lambda 4$ is amplified by the SOA 3. That is, since the SOA 3 constantly amplifies light, a state where carriers are consumed can be continued, and this suppresses carrier fluctuation. As a result, even if light enters the SOA 3, the carrier density in the SOA 3 does not decrease, the quality of the optical signal waveform is maintained, and malfunctions of signal processing can be reduced.

Note that, in a case where a bias is not applied to the EA optical modulator 2, the reflection wavelength $\lambda 2$ of the diffraction grating 22 of the EA optical modulator 2 described above is set to be on a longer wavelength side than the reflection wavelength $\lambda 4$ of the distributed Bragg reflector 4 by 0.1 to 10 nm. Furthermore, in a case where a bias is applied to the EA optical modulator 2, the reflection wavelength $\lambda 3$ of the diffraction grating 22 of the EA optical modulator 2 is shifted to be the same as the reflection wavelength $\lambda 4$ of the distributed Bragg reflector 4. Moreover, the distributed Bragg reflector 4 has an electrode structure to which a current can be injected, and the reflection wavelength $\lambda 4$ of the distributed Bragg reflector 4 can be adjusted by injecting the current to the electrode structure.

The invention claimed is:

1. An optical signal transmitter in which a distributed feedback laser, an electro absorption optical modulator, and one or more semiconductor optical amplifiers are integrally integrated, and a diffraction grating is formed in a region overlapping a light propagation mode of the electro absorption optical modulator so that a light intensity is modulated according to an intensity of an electric field added to the electro absorption optical modulator when light generated by the distributed feedback laser passes through the electro absorption optical modulator and the one or more semiconductor optical amplifiers in order, the optical signal transmitter comprising:

a distributed Bragg reflector coupled to an emission end surface of the one or more semiconductor optical amplifiers, wherein the distributed feedback laser, the electro absorption optical modulator, and the one or more semiconductor optical amplifiers, and the distributed Bragg reflector are integrally integrated in an optical circuit unit provided on an upper surface of one main surface of a substrate, the diffraction grating is formed on each of a side of a clad layer opposite to an active layer of the distributed feedback laser and an absorption layer of the electro absorption optical modulator and a side of an upper surface of a reflection layer of the distributed Bragg reflector, and an optical waveguide core portion formed by combining the active layer of the distributed feedback laser, the absorption layer of the electro absorption optical modulator, an active layer of the semiconductor optical amplifier, and the reflection layer of the distributed Bragg reflector is included.

2. The optical signal transmitter according to claim 1, wherein the optical circuit unit includes a passive layer in which the active layer of the distributed feedback laser, the absorption layer of the electro absorption optical modulator, and the active layer of the one or more semiconductor optical amplifiers are integrally integrated, and the optical waveguide core portion is formed by butt coupling the passive layer and the reflection layer.

3. The optical signal transmitter according to claim 1, wherein in a case where a bias is not applied to the electro absorption optical modulator, a reflection wavelength of the diffraction grating of the electro absorption optical modulator is longer than a reflection wavelength of the distributed Bragg reflector by 0.1 to 10 nm, and in a case where a bias is applied to the electro absorption optical modulator, the reflection wavelength of the diffraction grating of the electro absorption optical modulator is shifted to be the same as the reflection wavelength of the distributed Bragg reflector.

4. The optical signal transmitter according to claim 1, wherein the optical signal transmitter has an electrode structure capable of injecting a current to the distributed Bragg reflector, and adjustment of a reflection wavelength of the distributed Bragg reflector is possible by injecting the current to the electrode structure.

5. The optical signal transmitter according to claim 1, wherein a wavelength of light oscillated with the one or more semiconductor optical amplifiers as a gain is different from a wavelength of light oscillated by the distributed feedback laser.

* * * * *